April 21, 1964 R. RICE ETAL 3,129,990
CIRCUIT BOARD ASSEMBLY
Filed Dec. 1. 1960 2 Sheets-Sheet 1
FIG. 1
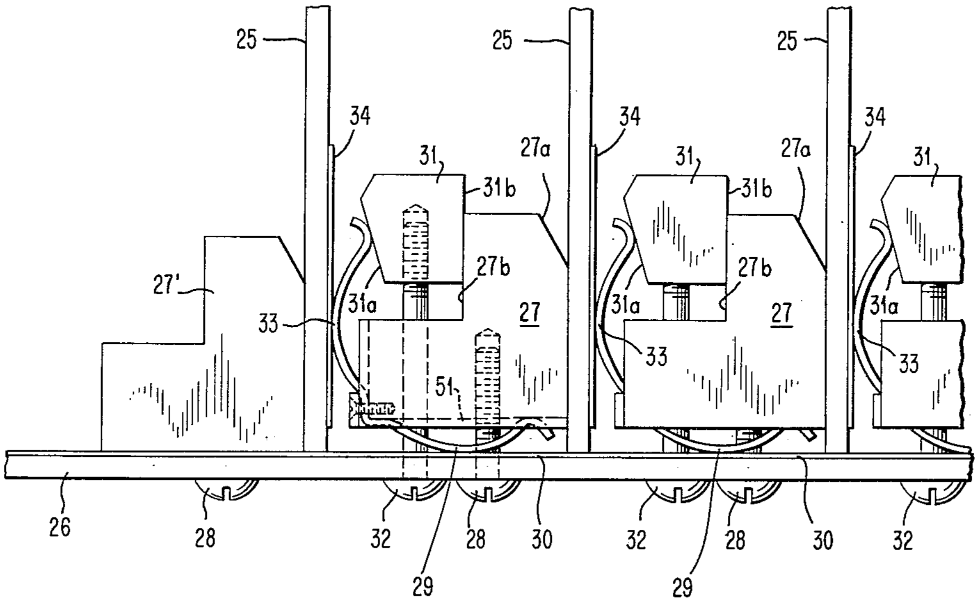
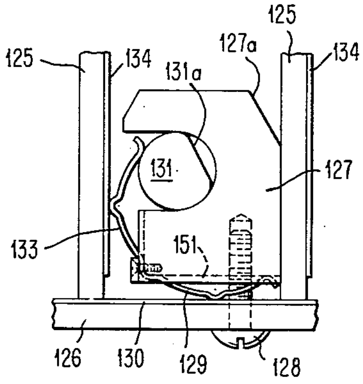
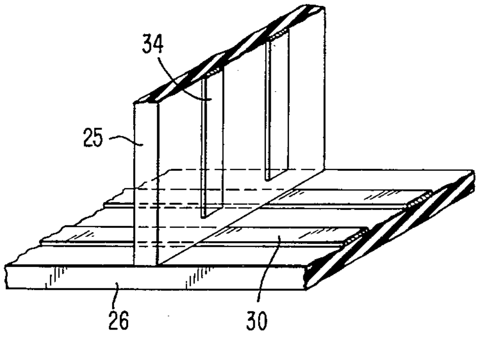
FIG. 2
FIG. 4
INVENTORS
REX RICE
JOHN J. SHEA
BY Elmer Galbraith
AGENT April 21, 1964 R. RICE ETAL 3,129,990

CIRCUIT BOARD ASSEMBLY

Filed Dec. 1, 1960 2 Sheets-Sheet 2

United States Patent Office 3,129,990
Patented Apr. 21, 1964

3,129,990

CIRCUIT BOARD ASSEMBLY

Rex Rice, Poughkeepsie, and John J. Shea, Highland, N.Y., assignors to International Business Machines Corporation, New York, N.Y., a corporation of New York Filed Dec. 1, 1960, Ser. No. 73,053
8 Claims. (Cl. 339—17)

This invention relates to printed circuitry and more particularly to an assembly of interconnected printed circuit boards.

Known devices for connecting to printed circuits are generally adapted to connect such circuits to a plurality of individual wires. In printed circuit board assemblies wherein it is desired to interconnect the circuitry on a plurality of subassembly printed circuit boards by means of a base printed circuit board, advantages in cost, reliability and packaging density can be achieved by providing means for connecting the circuitry on the subassembly boards directly to the circuitry on the baseboard rather than to a plurality of individual wires.

An object of the present invention is to provide an improved assembly of interconnected printed circuit boards.

Another object is to provide an assembly of printed circuit boards comprising a plurality of subassembly boards and a baseboard wherein the subassembly boards may be easily inserted into and removed from the assembly.

A further object of the invention is to provide a simple, inexpensive, reliable assembly of interconnected printed circuit boards.

A further object is to provide an assembly of interconnected printed circuit boards wherein good electrical connections are insured.

A further object is to provide an assembly of interconnected printed circuit boards wherein the mechanical force pushing the electrical contacts together may be increased after the circuit boards have been inserted into the assembly.

Another object is to provide an assembly which includes a base printed circuit board wherein connections can conveniently be made to circuits in the central portion of the base printed circuit board.

Another object is to provide a device for interconnecting electrical circuits which are on different printed circuit boards, said device also providing a mechanical connection between the printed circuit boards.

A further object is to provide a device wherein interconnections between different circuits on one printed circuit board can be made in the connector itself.

This invention provides a compact, reliable, inexpensive assembly of interconnected printed circuit boards wherein a plurality of subassembly boards are interconnected by a base printed circuit board. Each subassembly printed circuit board is held in a substantially perpendicular relationship to the base printed circuit board by a novel device which provides an electrical and mechanical connection between the subassembly boards and the baseboard. The resulting assembly is simple, inexpensive, compact and reliable. The subassembly boards may be inserted and removed while there is a minimum of force pressing the contacts against the circuitry on the boards, and the contact pressure can thereafter be increased to insure good electrical contact and to provide a mechanical holding force for the subassembly boards.

The foregoing and other objects, features and advantages of the invention will be apparent from the following more particular description of preferred embodiments of the invention, as illustrated in the accompanying drawings.

In the drawings:

FIG. 1 is a side view of an assembly of circuit boards illustrating a preferred embodiment of this invention.

FIG. 2 is an isometric view of a portion of the base printed circuit board with the printed circuitry thereon and of a portion of a subassembly printed circuit board with the printed circuitry thereon.

FIG. 4 is a cross-sectional view of an alternative preferred embodiment of the device for interconnecting the printed circuit boards.

Figure 3:
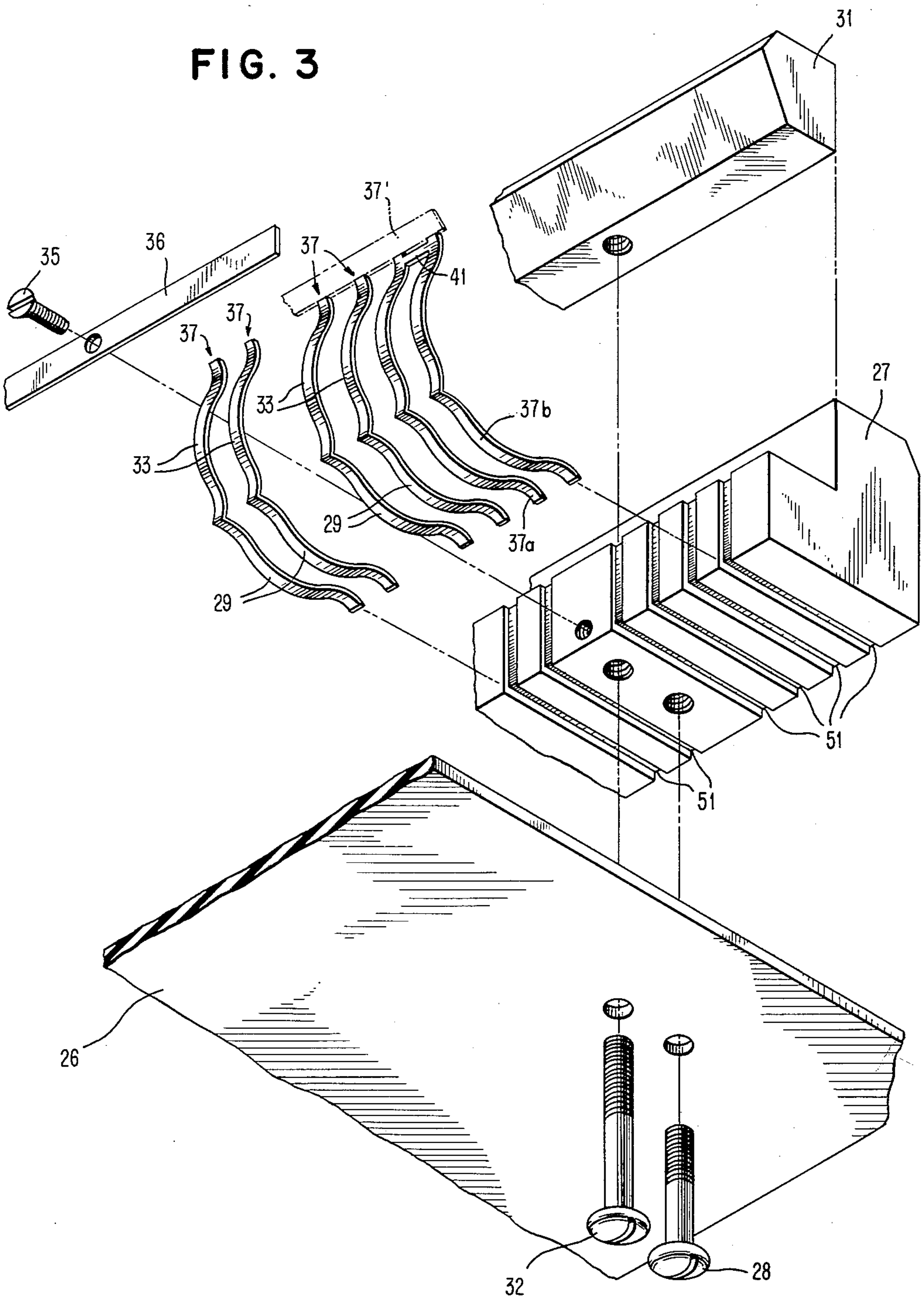
FIG. 3 is an exploded view of one of the devices for interconnecting the printed circuit boards.

In general, the embodiment of the invention shown in FIG. 1 is an assembly which comprises a series of subassembly printed circuit boards 25 connected to a base printed circuit board 26. Each subassembly printed circuit board 25 has associated therewith an elongated block 27, an elongated wedge 31 and a plurality of circuit connectors 37 (see FIG. 3, each connector 37 includes contact members 29 and 33). The elongated blocks 27 are secured to the base board 26 by screws 28 and the wedge is drawn into a groove in block 27 by screws 32. The contact members 29 are compressed against circuitry 30 on base board 26 by blocks 27, and the contact members 33 are compressed against circuitry 34 on subassembly printed circuit boards 25 by the action of wedge 31. Each block 27 also provides a back support for an adjacent subassembly board 25.

Initially screws 28 are tightened, fastening blocks 27 and 27' to the base board 26; however, screws 32 are not initially tightened so that the wedge 31 exerts a negligible force against the printed circuit boards 25. In this condition, the printed circuit boards 25 can be inserted (or removed) with little mechanical effort. Once the printed circuit boards 25 have been inserted, the screws 32 may be tightened, pulling the wedges 31 down into the grooves in the blocks 27, thereby forcing contact members 33 against the circuitry 34 on subassembly printed circuit boards 25. The pressure from wedges 31 insures that there will be a good electrical connection between contact members 33 and circuitry 34 on the subassembly printed circuit boards 25 and it furthermore provides a firm mechanical locking action for and retention of subassembly boards 25. Contact members 29 are pressed against the base printed circuit boards 26 through the action of screws 28, which urge blocks 27 down onto base board 26. Each contact member 29 and 33 comprises an independent spring (i.e., a resilient finger) and, hence, it can compensate for any irregularity in the surface height of the circuitry which it contacts thereby insuring good electrical connections.

Since connectors 37 do not have to be riveted or bolted to a printed circuit board, they can be made very narrow, thereby facilitating high density packaging. Furthermore, since connectors 37 are not riveted or otherwise permanently attached to the circuitry on the printed circuit boards, the connections can be quickly changed. The circuitry on the printed circuit boards is not damaged or deformed when a connection is made to it, as it would be if a soldered connection were made.

It should be noted that the entire assembly may involve a large number of subassembly boards. Only three are shown for convenience of illustration.

Some of the features of the embodiment of the invention shown in FIGS. 1, 2 and 3 will now be described more specifically.

The face *27b* of each block 27 and the face *31b* of the associated wedge 31 slide over each other as the wedges 31 are pulled down by the screws 32. Since the blocks 27 are secured by screws 28, the wedges 31 move straight down and the inclined faces *31a* force the contact members 33 against the circuitry 34 on the subassembly boards 25. In order to facilitate access to screws 28 and 32 they can be extended through the tops of blocks 27 and wedges 31.

The connectors 37 are constructed of a resilient metal having good electrical conductive properties and good spring properties such as beryllium copper. They are attached to blocks 27 by screws 35 and the nonconducting strip 36. Each connector 37 fits into an associated groove 51 in the block 27. These features are clearly shown in FIG. 3.

Connectors 37*a* and 37*b* (FIG. 3) which are electrically connected by the conducting bar 41 exemplify how a connection can be made between two circuits which are on one board. The block 27 presses the connector 37*a* against one circuit and connector 37*b* against another circuit and these circuits are connected by bar 41. There are many reasons why this type of connection might be desired. For instance, the base board could be a standard circuit board which could be used for different purposes depending upon the connections made in the connecting device, or interconnections could be made in the connecting device between non-adjacent circuits on one circuit board.

Although each slot 51 is shown as having a connector 37 therein, it is understood that some of the slots may be left vacant if no interconnections are required.

The last subassembly printed circuit board 25 on the left in the series shown in FIG. 1 is supported on its reverse side by a block 27' (here shown as identical to the blocks 27) which performs no function other than supporting the back of the last printed circuit board 25. A more simple structure could be used as a back support for this particular board; however, for economy by standardization, block 27' was made identical to blocks 27. The back support for each printed circuit board 25 other than the last one in the series is provided by the back edge of the block 27 which is associated with the next printed circuit board in the series.

The upper edge of each of the blocks 27 is beveled at 27*a* to facilitate the insertion of the circuit boards 25.

Note that the pattern of circuitry 30 and 34 shown in FIG. 2 is merely meant to be exemplary. The actual circuitry on the boards may consist of any desired pattern; however, circuitry 30 and 34 and contacts 37 must be so placed that the contact members engage the appropriate circuitry.

Both active and passive components may be included in both the circuitry 30 and 34. However, a particularly useful and practical assembly can also be formed by using the base board 26 merely to provide interconnections in circuitry 30 between a plurality of subassembly boards 25 in which the circuitry 34 contains active components. The active components on the subassembly boards 25 can then be easily removed and replaced for servicing.

For ease in assembly the connectors 37 which fit on any one block 27 may be originally manufactured with a strip of metal 37' connecting them along one end. Such a piece of metal is shown in phantom in FIG. 3. These connectors are then placed into slots 51 in block 27 as one unit and screws 35 and strip 36 are assembled. Thereafter the strip 37' is broken off at a prescored parting line.

FIG. 4 shows an alternative embodiment of the assembly. The major difference in this alternate embodiment is that the elongated wedge 31 is replaced by an elongated eccentric cam 131. The contact arms 129 are forced against the circuitry 130 on the base board 126 by the screws 128 as in the first embodiment. However, the contact arms 133 are pressed against the circuitry 134 on the subassembly boards 125 by the rotatable eccentric cam 131 rather than by a wedge. When the cam is rotated so that the ends of the contact members 133 rest on the rounded portion of the cam surface (as shown in the drawing), the cam presses the contact arms 133 against the circuitry 134 on the subassembly boards 125, but when the cam is rotated so that the ends of the contact members 133 rest on the flat cam face 131*a*, the contact arms 133 are not pressed against the circuitry 134 so that the subassembly boards 125 can be inserted and removed. Hence, the subassembly boards 125 can be engaged or disengaged merely by rotating the cam 131. The end of the cam 131 can be made to extend beyond the end of subassembly boards 125 to facilitate operation of the cam.

Another embodiment of the invention (not shown) for use in assemblies wherein the subassembly boards have printed circuitry on both sides thereof allows connections to be made to the circuitry on both sides of the subassembly boards. In this type of embodiment the cam 131 is in the center of the block 127 and there are contacts 133 which rest on the cam 131 on each side of the block 127.

It should be noted that the term "printed circuit" is used broadly throughout this specification and in the appended claims to include circuit boards made by any of the methods known in the art for depositing a pattern of conductive areas such as metal spraying, photographic electrodeposition, vacuum metalizing, silk screen processes, etc.

While the invention has been particularly shown and described with reference to preferred embodiments thereof, it will be understood by those skilled in the art that the foregoing and other changes in form and details may be made therein without departing from the spirit and scope of the invention.

We claim:

1. An assembly comprising a first board, a second board, said boards being in a substantially perpendicular relationship, electrical circuitry on said boards, said electrical circuitry on said second board extending to near an edge of said board on a first side thereof, a device for connecting the circuitry on said first board to the circuitry on said second board comprising an elongated block; said block being positioned adjacent to the electrical circuitry on said first board, said second board being positioned with said electrical circuitry on the edge thereof positioned adjacent to said block; means disposed on the second side of said second board for restraining the motion of said second board in the direction of said means; means for urging said block towards said first board; a plurality of first conductive means adapted to fit between said elongated block and the circuitry on said first board, whereby said block presses said first conductive means into engagement with the circuitry on said first printed circuit board; elongated wedge means adapted to fit between said elongated block and said second board; a plurality of second conductive means adapted to fit between said elongated wedge and the circuitry on said second board; means interconnecting said first conductive means and said second conductive means; and means urging said elongated wedge between said elongated block and said second board to press said second conductive means into engagement with said electrical circuits on said second board to form electrical connections and to provide a mechanical support for said second board.

2. An assembly comprising a base board, a plurality of subassembly boards, said subassembly boards being disposed adjacent to and substantially perpendicular to said base board, electrical circuitry on said base board and on said subassembly boards, a plurality of elongated blocks; one for each of said subassembly boards; means for urging said elongated block towards said base board; a plurality of electrical connectors for each elongated block, each connector having first and second interconnected resilient fingers, said first resilient fingers positioned between the associated elongated block and the circuitry on said base board, whereby said elongated block presses the associated first resilient fingers into engagement with the circuitry on said base board; an elongated wedge means for each of said elongated blocks, said elongated wedge means positioned between the associated elongated block and the associated subassembly board; said second resilient fingers positioned between the associated elongated wedge and the circuitry on the associated subassembly board; and means urging said elongated wedge means between the associated elongated blocks and the associated subassembly boards to force said second resilient fingers into engagement with the circuitry on said subassembly boards.

3. An assembly comprising a base board, a plurality of subassembly boards, said subassembly boards being disposed adjacent to and substantially perpendicular to said base boards, said boards each including printed circuitry thereon, a plurality of elongated blocks, one for each of said subassembly boards, each of said blocks adapted to fit between the associated subassembly board and an adjacent subassembly board, means for securing said elongated blocks to said base board to prevent lateral motion of said block and to urge said blocks toward the circuitry on said base board; a plurality of first conductive means; said first conductive means positioned between the associated elongated block and the circuitry on said base board whereby said first conductive means are pressed into engagement with the circuitry on said base board by said associated block; an elongated wedge means for each of said elongated blocks, said elongated wedge means positioned between the associated elongated block and the associated subassembly board; a plurality of second conductive means for each of said elongated blocks, said second conductive means positioned between the associated elongated wedge and the circuitry on the associated subassembly board; means interconnecting the first conductive means and the second conductive means associated with each of said elongated blocks; and means urging said elongated wedge means between the associated elongated blocks and the associated subassembly boards to push each subassembly board against the adjacent elongated block, to mechanically engage said subassembly boards and to connect said second conductive means to said circuitry on said subassembly boards.

4. The device recited in claim 3 wherein each elongated block has a groove to receive the associated elongated wedge means.

5. An assembly comprising a base board, a plurality of subassembly boards disposed adjacent to and substantially perpendicular to said base board, said boards each including printed circuitry thereon, a plurality of elongated blocks, one for each of said subassembly boards, each of said blocks being adapted to fit between the associated subassembly board and an adjacent subassembly board, means for securing said elongated blocks to said base board to prevent lateral motion of said blocks and to urge said blocks toward said base board; a plurality of electrical connectors for each elongated block, each electrical connector having first and second interconnected resilient fingers, said first resilient fingers being shaped to fit and being positioned between the associated elongated block and the circuitry on said base board, whereby said elongated block presses the associated first resilient fingers into engagement with the circuitry on said base board; an elongated wedge means for each of said elongated blocks, said elongated wedge means being adapted to fit between the associated elongated block and the associated subassembly board; said second resilient fingers being shaped to fit and being positioned between the associated elongated wedge and the associated subassembly board; and means urging said elongated wedge means between the associated elongated block and the associated subassembly board to push each subassembly board against the adjacent elongated block, to mechanically engage said subassembly boards and to establish electrical connections between the circuitry on said subassembly boards and said second resilient fingers.

6. An assembly comprising in combination a base board, a plurality of subassembly boards, said subassembly boards being disposed adjacent to and substantially perpendicular to said base board, electrical circuitry on said base board and on said subassembly boards, a plurality of elongated blocks, one for each of said subassembly boards; means for urging said elongated blocks towards said base board; a plurality of first conductive means for each elongated block, said first conductive means positioned between the associated elongated block and said base board, whereby said elongated block presses the associated first conductive means into engagement with the circuitry on said base board; an elongated rotatable cam for each of said elongated blocks, said block having a groove to hold said cam between the associated elongated block and the associated subassembly board; a plurality of second conductive means for each of said elongated blocks, said second conductive means positioned between the associated elongated cam and the associated subassembly board; means interconnecting the first conductive means and the second conductive means associated with each of said elongated blocks; and means for rotating each cam to press said second conductive means against said circuitry on said subassembly printed circuit boards.

7. An assembly comprising a first board, a second board, said boards being in a substantially perpendicular relationship, said boards each including electrical circuitry thereon, said electrical circuitry on said second board extending to near an edge of said board on a first side thereof, a device for connecting the circuitry on said first board to the circuitry on said second board comprising an elongated block; said block being positioned adjacent to the electrical circuitry on said first board, said second board being positioned with said electrical circuitry on the edge thereof positioned adjacent to said device; means disposed on the second side of said second board for restraining the motion of said second board in the direction of said means; means for urging said block towards said first board; a plurality of first conductive means positioned between said elongated block and the circuitry on said first board, whereby said block presses said first conductive means into engagement with the circuitry on said first printed circuit board, a circumferentially eccentric elongated cam between said elongated block and said second board; a plurality of second conductive means positioned between said elongated cam and the circuitry on said second board; means interconnecting said first conductive means and said second conductive means; and means for rotating said eccentric elongated cam to press said second conductive means into engagement with said electrical circuits on said second board to form electrical connections and to provide a mechanical support for said second board.

8. An assembly comprising in combination a base board, a plurality of subassembly boards, said subassembly boards being disposed adjacent to and substantially perpendicular to said base board, electrical circuitry on said base board and on said subassembly boards, a plurality of elongated blocks; one for each of said subassembly boards; means for urging said elongated blocks towards said base board; a plurality of electrical connectors for each elongated block, each electrical connector having first and second interconnected resilient fingers, said first resilient fingers positioned between the associated elongated block and the circuitry on said base board, whereby said elongated block presses the associated first resilient fingers into engagement with the circuitry on said base board; an elongated eccentric cam for each of said elongated blocks, each elongated block having a groove for holding the associated eccentric cam next to the associated subassembly board; said second resilient fingers shaped to fit between the associated elongated cam and the circuitry on the associated subassembly board; and means for rotating said eccentric elongated cams to press said second resilient fingers toward the associated subassembly boards making electrical connection between the circuitry on said subassembly boards and said second resilient fingers.

References Cited in the file of this patent

UNITED STATES PATENTS

| | | |
|---|---|---|
| 2,628,263 | Bulla | Feb. 10, 1953 |
| 2,651,833 | Kernaban | Sept. 15, 1953 |
| 2,694,249 | Kapp | Nov. 16, 1954 |
| 2,730,683 | Ayres et al. | Jan. 10, 1956 |
| 2,832,942 | French | Apr. 29, 1958 |
| 2,857,577 | Vanderpool | Oct. 21, 1958 |
| 2,876,390 | Sanders | Mar. 3, 1959 |
| 2,879,493 | Bender | Mar. 24, 1959 |
| 2,906,990 | Cain | Sept. 29, 1959 |
| 2,942,229 | Berger | June 21, 1960 |
| 2,944,121 | Wasylenko | July 5, 1960 |
| 2,993,187 | Bisbing et al. | July 18, 1961 |
| 3,037,181 | Leshner | May 29, 1962 |